(12) United States Patent
Agata

(10) Patent No.: US 6,914,840 B2
(45) Date of Patent: Jul. 5, 2005

(54) SEMICONDUCTOR MEMORY CIRCUIT

(75) Inventor: Masashi Agata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/790,135

(22) Filed: Mar. 2, 2004

(65) Prior Publication Data

US 2004/0174735 A1 Sep. 9, 2004

(30) Foreign Application Priority Data

Mar. 3, 2003 (JP) ....................................... 2003-055790

(51) Int. Cl.$^7$ ............................................... G11C 7/02
(52) U.S. Cl. ..................................... 365/210; 365/203
(58) Field of Search .............................. 365/210, 203, 365/204

(56) References Cited

U.S. PATENT DOCUMENTS

| 5,297,077 | A | * | 3/1994 | Imai et al. .................. | 365/145 |
| 6,111,802 | A | | 8/2000 | Kano et al. | |
| 6,297,986 | B1 | * | 10/2001 | Jae Kap ..................... | 365/145 |
| 6,567,298 | B2 | * | 5/2003 | Kato et al. .................. | 365/149 |

OTHER PUBLICATIONS

P.R. Schroeder et al., "A 16K×1 Bit Dynamic RAM", ISSCC Digest of Technical Papers U.S.A. ISSCC (International Solid–State Circuits Conference), Feb. 1977, pp. 12–13.

J. Barth, et al., "A 300MHz Multi–Banked eDRAM Macro Featuring GND Sense, Bit–Line Twisting and Direct Reference Cell Write", ISSCC Digest of Technical Papers, U.S.A. ISSCC (International Solid–State Circuits Conference), Feb. 2002, pp. 156–157.

* cited by examiner

Primary Examiner—Vu A. Le
(74) Attorney, Agent, or Firm—McDermott Will & Emery LLP

(57) ABSTRACT

Data reading speed of a DRAM is enhanced without causing an increase in the power consumption and in the chip area. To that end, when data is read, a pair of bit lines is precharged to a GND level, while a dummy cell is charged at a power supply voltage. Immediately after a word line and a dummy word line are activated and their respective potentials are increased by the threshold voltage of an access transistor, a main capacitor and a dummy capacitor are electrically connected to the bit lines, thereby allowing the data to fade in. The resultant potential difference between the pair of bit lines is detected and amplified by a sense amplifier, thereby enabling the data to be read. The capacitance of the dummy capacitor is about half of that of the main capacitor, so that the dummy capacitor can be precharged at the power supply voltage.

14 Claims, 14 Drawing Sheets

US 6,914,840 B2

1

SEMICONDUCTOR MEMORY CIRCUIT

BACKGROUND OF THE INVENTION

The present invention relates to semiconductor memory circuits, and more particularly relates to memory access techniques with respect to dynamic memories.

Among the semiconductor memory circuits, dynamic random-access memories (hereinafter referred to as "DRAMs") have been widely used as devices capable of reading and writing a large amount of data. FIG. 12 illustrates the circuit configuration of a typical DRAM which is currently in practical use. The DRAM 100 shown in FIG. 12 includes a memory cell 101, a sense amplifier 102, and a precharge circuit 103. Hereinafter, referring to a timing chart shown in FIG. 13, how the DRAM 100 reads data will be described.

First, the precharge circuit 103 is activated (PRE="H") when the memory cell 101 is inactive (WL="L"), so that a pair of bit lines BL and BLX (hereinafter referred to as a "bit line pair BL and BLX") is precharged to a voltage VDD/2 (VDD is a power supply voltage.) The precharge circuit 103 is then inactivated (PRE="L"), while at the same time a word line WL is activated (WL="H"), whereby a capacitor 110 in the memory cell 101 is electrically connected to the bit line BL, causing accumulated charge to be reallocated between the capacitor 110 and the bit line BL. Specifically, if the amount of charge accumulated in the capacitor 110 is larger, that is, when the memory cell 101 stores therein data "1", the accumulated charge in the capacitor 110 is supplied to the bit line BL. On the other hand, if the amount of charge accumulated in the capacitor 110 is smaller, that is, when the memory cell 101 stores therein data "0", the charge is transferred from the bit line BL to the capacitor 110. More specifically, suppose the case in which the data stored by the memory cell 101 is "1". The charge reallocation results in an increase in the potential of the bit line BL by $\Delta V$, which produces a potential difference $\Delta V$ between the bit line pair BL and BLX. The sense amplifier 102 senses and amplifies this potential difference, thereby permitting the data "1" to be read from the DRAM 100.

In recent years, the degree of integration of DRAMs has been increasing along with the advancement of minute processing techniques for semiconductor integrated circuits. In addition, in order to reduce the power consumption of such highly-integrated DRAMS, the power supply voltage has been lowered. Nevertheless, it is difficult to decrease the threshold voltage of MOS transistors in proportion to the lowering of the power supply voltage because of variations caused in fabrication processes. Therefore, in DRAMs of the above-mentioned VDD/2 precharge type, the lowered power supply voltage increases the ratio of the threshold voltage of the MOS transistors to the power supply voltage. Particularly, in DRAMs after the 0.10-$\mu$m process generation, there would be little difference between the threshold voltage of the MOS transistors forming the sense amplifier 102 and the voltage VDD/2, whose magnitude is the voltage amplitude of the bit line pair BL and BLX. In that case, activating the sense amplifier 102 would not produce a sufficient potential difference between the gate and source of those transistors, causing the sense amplifier 102 to be significantly delayed in, or become incapable of, performing sensing operation for the bit line pair BL and BLX.

In order to solve the above problem, it is preferable that the voltage between the gate and source of sense amplifier transistors be large. With respect to this, the following prior art technique has been proposed.

2

FIG. 14 illustrates the circuit configuration of a conventional VDD-precharge DRAM. The DRAM 200 shown in FIG. 14, which is of NMOS type, includes a memory cell 201, a sense amplifier 202, a precharge circuit 203, and a dummy cell 204. Hereinafter, data-read operation by the DRAM 200 will be discussed with reference to a timing chart shown in FIG. 15.

First, the precharge circuit 203 is activated (P="H") when the memory cell 201 is inactive (WL="L"), so that a pair of bit lines BL and BLX is precharged to a voltage VDD−Vth (Vth is the threshold voltage of NMOS transistors forming the precharge circuit 203.) At this time, a signal PRE="H", and a dummy capacitor 220 in the dummy cell 204 is charged to a GND level. Then, the signals P and PRE are put to "L", while at the same time a word line WL and a dummy word line DWL are activated (WL="H", DWL="H"). This establishes an electrical connection between a main capacitor 210 in the memory cell 201 and the bit line BL, and between the dummy capacitor 220 in the dummy cell 204 and the bit line BLX, resulting in the reallocation of electric charge. Suppose a case in which the data stored by the memory cell 201 is "0". The charge reallocation between the main capacitor 210 and the bit line BL reduces the potential of the bit line BL by $\Delta V$. Likewise, the charge reallocation between the dummy capacitor 220 and the bit line BLX causes the potential of the bit line BLX to be decreased by $\Delta Vref$. In this DRAM, the dummy capacitor 220 is configured so as to have capacitance which is about half of that of the main capacitor 210, such that the decrease $\Delta Vref$ in the bit line BLX potential is about half of the decrease $\Delta V$ in the bit line BL potential. The resultant potential difference caused between the bit line pair BL and BLX is sensed and amplified by the sense amplifier 202, thereby allowing the data "0" to be read from the DRAM 200 (see document 1, for example.)

Meanwhile, FIG. 16 illustrates the circuit configuration of a conventional GND-precharge DRAM. The DRAM 300 shown in FIG. 16, which is of NMOS type, includes a memory cell 301, a sense amplifier 302, a precharge circuit 303, and a reference cell (dummy cell) 304. Hereinafter, data-read operation by the DRAM 300 will be discussed with reference to a timing chart shown in FIG. 17.

First, the precharge circuit 303 is activated (EQP="H") when the memory cell 301 is inactive (WL0="L"), so that a pair of bit lines BC and BT is precharged to a GND level. At this time, a signal REQP="H", and the dummy cell 304 is precharged to VDD/2. Then, a word line WL0 and a reference word line (a dummy word line) RFWL0 are activated (WL0="H", RFWL0="H"). This establishes an electrical connection and then causes charge reallocation between a main capacitor 310 in the memory cell 301 and the bit line BC and between a dummy capacitor 320 in the dummy cell 304 and the bit line BT. Suppose a case in which the data stored by the memory cell 301 is "1". The charge reallocation between the main capacitor 310 and the bit line BC increases the potential of the bit line BC by $\Delta V$. Likewise, the charge reallocation between the dummy capacitor 320 and the bit line BT results in an increase of $\Delta Vref$ in the potential of the bit line BT. In this DRAM, the accumulated charge in the dummy capacitor 320 is about half of the maximum amount of accumulated charge in the main capacitor 310, such that the increase $\Delta Vref$ in the bit line BT potential is about half of the increase $\Delta V$ in the bit line BC potential. The resultant potential difference created between the bit line pair BC and BT is sensed and amplified by the sense amplifier 302, allowing the data "1" to be read from the DRAM 300 (see document 2, for example.)

(Document 1) Paul R. Schroeder and another person. (A 16K×1 Bit Dynamic RAM) "ISSCC Digest of Technical Papers" U.S.A. ISSCC (International Solid-State Circuits Conference) February 1997 pp. 12–13.

(Document 2) Barth and three other persons. (A 300 MHz Multi-Banked eDRAM Macro Featuring GND Sense, Bit-Line Twisting and Direct Reference Cell Write) "ISSCC Digest of Technical Papers" U.S.A. ISSCC (International Solid-State Circuits Conference) February 2002 pp. 156–157.

In the DRAM 200 shown in FIG. 14, the bit line pair BL and BLX is precharged to the power supply voltage VDD that corresponds to the activated logic level for the word line WL and the dummy word line DWL. Therefore, even if the word line WL is activated, the main capacitor 210 cannot be electrically connected to the bit line BL, unless the voltage of the word line WL is raised to a voltage level that exceeds the voltage of the bit line BL by the threshold voltage Vth of the NMOS transistor forming the memory cell 201. This holds true for the dummy capacitor 220. Moreover, the numerous memory cells connected to the word line WL make the word line WL heavily loaded, which slows the voltage-level transition time taken in activating the word line WL. More specifically, it takes a relatively long time before the potential difference between the bit line pair BL and BLX occurs, leading to the problem that the access time for data reading is long.

In the DRAM 300 shown in FIG. 16, on the other hand, the bit line pair BC and BT is precharged to the GND-voltage level that corresponds to the inactivation logic level for the word line WL0 and the dummy word line RFWL0. Therefore, immediately after the activation level of the word line WL0 exceeds the threshold voltage Vth of the NMOS transistor forming the memory cell 301, the main capacitor 310 is electrically connected with the bit line BC. This holds true for the dummy capacitor 320. The level transition of the bit line BC occurs at a relatively high speed with respect to the level transition of the word line WL0. Therefore, the time required for data reading can be shortened, thereby enhancing the speed of memory access.

Nevertheless, the DRAM 300 shown in FIG. 16 is not designed in such a manner that different activation/inactivation voltage levels are given to the word line WL0 of the memory cell 301 and the dummy word line RFWL0 of the dummy cell 304. Normally, in DRAMs, the activation level for a word line is set at a voltage higher than the high level of output from the sense amplifier (that is, the high level of the bit line reached when the bit line is amplified by the sense amplifier.) in consideration of writing of high-level data into the memory cells. The inactivation level for the word line is preferably set at a voltage lower than the low level of the sense amplifier output (that is, the low level of the bit line reached when the bit line is amplified by the sense amplifier.) in consideration of data retention characteristics. As a result, the voltage amplitude of the word line becomes large. If a dummy word line having such large amplitude as that of the word line is also driven, the power consumption will be increased. Furthermore, if boosted power supply generated in the semiconductor chip is used in order to drive the word line of such great amplitude, the area of the power supply booster circuit will increase.

Moreover, in the DRAM 300 shown in FIG. 16, a voltage at the VDD/2 level is supplied to the dummy cell 304, which requires the DRAM 300 to include an internal power-supply-voltage generating circuit that produces the VDD/2-level voltage. Providing such a dedicated internal power-supply-voltage generating circuit, however, leads to an increase in the chip area as well as in the power consumption.

In addition, the DRAM 300 shown in FIG. 16 includes a dedicated precharge transistor 342 for supplying a VDD/2-level voltage to the dummy cell 304. The precharge transistor 342 has to be connected to the storage node of the dummy capacitor 320, to which an end of an access transistor 341 is connected. If only the storage node portion in the dummy cell 304 is formed into a different shape from that of the ordinary memory cells in the minute processing so as to be connected to the precharge transistor 342 as well, the optimization of the manufacturing process will be difficult.

SUMMARY OF THE INVENTION

In view of the above problems, it is therefore an object of the present invention to shorten the time after the transition of a word line to an activation level has started and until a signal that corresponds to data in a memory cell is read via a bit line, and hence to improve the data access time. Another object of the present invention is to provide a semiconductor memory circuit whose data access time has been improved without causing an increase in the power consumption and in the chip area. Another object of the present invention is to provide a semiconductor memory circuit that can be fabricated by inexpensive processes which can be easily optimized.

In order to achieve the above objects, an inventive semiconductor memory circuit includes a memory cell that includes a first capacitor for storing therein electric charge corresponding to stored data, and a first transistor whose gate is connected to a word line and one of whose source and drain is connected to a first bit line, while the other of whose source and drain is connected to the first capacitor; a dummy cell that includes a second capacitor having smaller capacitance than the first capacitor, a second transistor whose gate is connected to a dummy word line, and one of whose source and drain is connected to a second bit line, while the other of whose source and drain is connected to the second capacitor, and a third transistor for electrically connecting the second capacitor with a voltage line in accordance with a precharge signal when the dummy word line is inactive, the voltage line supplying a first voltage; a precharge circuit for precharging the first and second bit lines to a second voltage when the word line and the dummy word line are inactive; and a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the first voltage and to the second voltage, or to the second voltage and to the first voltage, respectively. The transitions of the word line and the dummy word line from the inactivation voltage level to the activation voltage level are both in a direction from the second voltage to the first voltage.

In the inventive circuit, the transition of the word line to the active state is directed going from the second voltage, which is the precharge voltage of the bit line, to the first voltage, which is the voltage of the bit line after the amplification. Then, as compared to a case where the transition is made in the opposite direction, the point in time at which the first transistor is turned on is made earlier, that is, the point in time when the voltage of the word line connected to the gate of the transistor in the memory cell goes beyond the threshold voltage of the first transistor toward the second voltage, which is the precharge voltage of the bit line connected to the source, comes earlier. As a result, the access time required for data reading can be shortened. Further, the dummy cell capacitor has smaller capacitance than the memory cell capacitor. This difference in the capacitance allows an intermediate reference potential to be generated, thereby eliminating the need for providing a circuit for precharging the dummy cell to the intermediate potential.

The capacitance of the second capacitor is preferably substantially half of the capacitance of the first capacitor. Then, the amount of variation in the second bit line potential can be about half of the amount of variation caused in the potential of the first bit line, so that the sense amplifier can sense and amplify the potential difference between the first and second bit lines more reliably.

The first and second capacitors are preferably both stacked capacitors, and the first capacitor is preferably formed to have HSG (Hemi Spherical Grained) structure. Alternatively, the first capacitor is preferably a stacked capacitor or a trench capacitor, and the second capacitor is preferably a planar capacitor. Then, integration with respect to the first capacitor can be accomplished by ultrafine processing, while the second capacitor can be formed easily.

Further, the amplitude of the dummy word line voltage is preferably smaller than the amplitude of the word line voltage. This allows a reduction in the power consumption of the semiconductor memory circuit.

In order to achieve the above objects, another inventive semiconductor memory circuit includes: a memory cell that includes a first capacitor for storing therein electric charge corresponding to stored data, and a first transistor whose gate is connected to a word line and one of whose source and drain is connected to a first bit line, while the other of whose source and drain is connected to the first capacitor; a dummy cell that includes a second capacitor, a second transistor whose gate is connected to a dummy word line, and one of whose source and drain is connected to a second bit line, while the other of whose source and drain is connected to the second capacitor, and a third transistor for electrically connecting the second capacitor with a voltage line in accordance with a precharge signal when the dummy word line is inactive, the voltage line supplying a first voltage; a precharge circuit for precharging the first and second bit lines to a second voltage when the word line and the dummy word line are inactive; and a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the second voltage and to a third voltage, or to the third voltage and to the second voltage, respectively. The transitions of the word line and the dummy word line from the inactivation voltage level to the activation voltage level are both in a direction from the second voltage to the third voltage. The amplitude of the dummy word line voltage is smaller than the amplitude of the world line voltage.

According to the present invention, as explained above, the point in time at which the transistor in the memory cell is turned on is made earlier, thereby shortening the access time required for data reading. Furthermore, the voltage amplitude of the dummy word line is made smaller than that of the word line for reduced power consumption.

The capacitance of the second capacitor is preferably substantially equal to the capacitance of the first capacitor, and the first voltage is preferably an intermediate voltage between the second and third voltages. Then, the amount of variation in the second bit line potential can be about half of the amount of potential variation in the first bit line, enabling the sense amplifier to sense and amplify the potential difference between the first and second bit lines more reliably.

Furthermore, the first and second transistors are preferably NMOS transistors, and the inactivation voltage of the dummy word line is preferably higher than the inactivation voltage of the word line. Specifically, the inactivation voltage of the word line is lower than the second voltage, and the inactivation voltage of the dummy word line is substantially equal to the second voltage.

When the transistors forming the memory cell and the dummy cell are NMOS transistors, normally, the inactivation voltage of the word line is lowered below the second voltage (e.g., GND) to suppress leakage of charge accumulated in the first capacitor, and hence to improve the charge retention characteristics. However, since the second capacitor does not serve to accumulate therein charge that corresponds to the stored data, no particular consideration needs to be given to leakage of the charge. Therefore, the potential of the dummy word line does not have to be reduced in such a manner as in the word line. Accordingly, by increasing the inactivation voltage of the dummy word line beyond the inactivation voltage of the first word line, that is, by decreasing the inactivation voltage of the word line alone, the amplitude of the dummy word line can be suppressed for reduced power consumption. Moreover, the dummy word line does not have to be supplied with a reduced voltage, which allows the power supply circuitry to have a simplified structure, thereby enabling a reduction in the circuit area in the whole semiconductor memory circuit.

Moreover, the first and second transistors are preferably PMOS transistors, and the inactivation voltage of the dummy word line is preferably lower than the inactivation voltage of the word line. Specifically, the inactivation voltage of the word line is higher than the second voltage, and the inactivation voltage of the dummy word line is substantially equal to the second voltage.

When the transistors forming the memory cell and the dummy cell are PMOS transistors, the circuit characteristics are opposite to those in a case of NMOS transistors. Thus, by lowering the inactivation voltage of the dummy word line below the inactivation voltage of the word line, that is, by raising only the inactivation voltage of the word line, leakage of charge in the first capacitor as well as the amplitude of the dummy word line can be suppressed, thereby reducing the power consumption. Moreover, the dummy word line does not have to be supplied with an elevated voltage, which allows the power supply circuitry to have a simplified structure, thereby enabling a reduction in the circuit area in the whole semiconductor memory circuit.

In the inventive semiconductor memory circuits, the second and third transistors are preferably disposed substantially on a straight line with the second capacitor being interposed between the second and third transistors. More preferably, the first and second capacitors are both planar capacitors.

Then, the second and third transistors can be disposed at both sides of the second planar capacitor, and the portions connected to the second and third transistors can have a similar shape as the connecting portion in which the first transistor of the memory cell is connected to the first planar capacitor. Accordingly, the manufacturing processes for the memory cell array can be easily optimized.

BRIEF DESCRIPTION OF THE DRAWINGS

FIG. 2A illustrates a circuit configuration in a case in which a memory cell in the semiconductor memory circuit of FIG. 1 is formed of a planar capacitor cell, while

Figure 14:
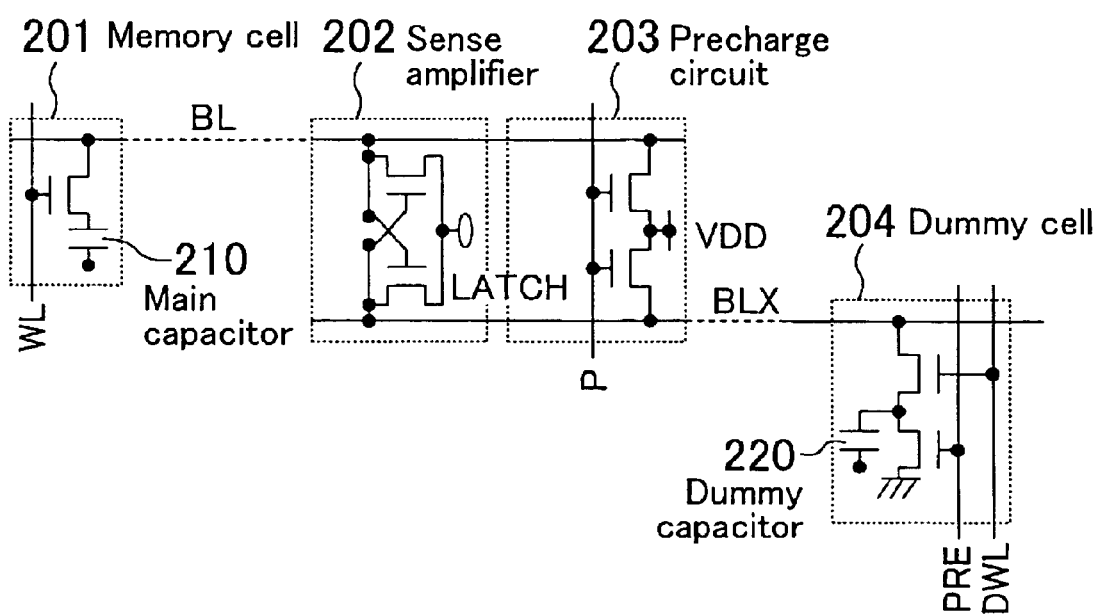

The FIG. 14 illustrates the circuit configuration of a conventional VDD-precharge DRAM.

Figure 15:
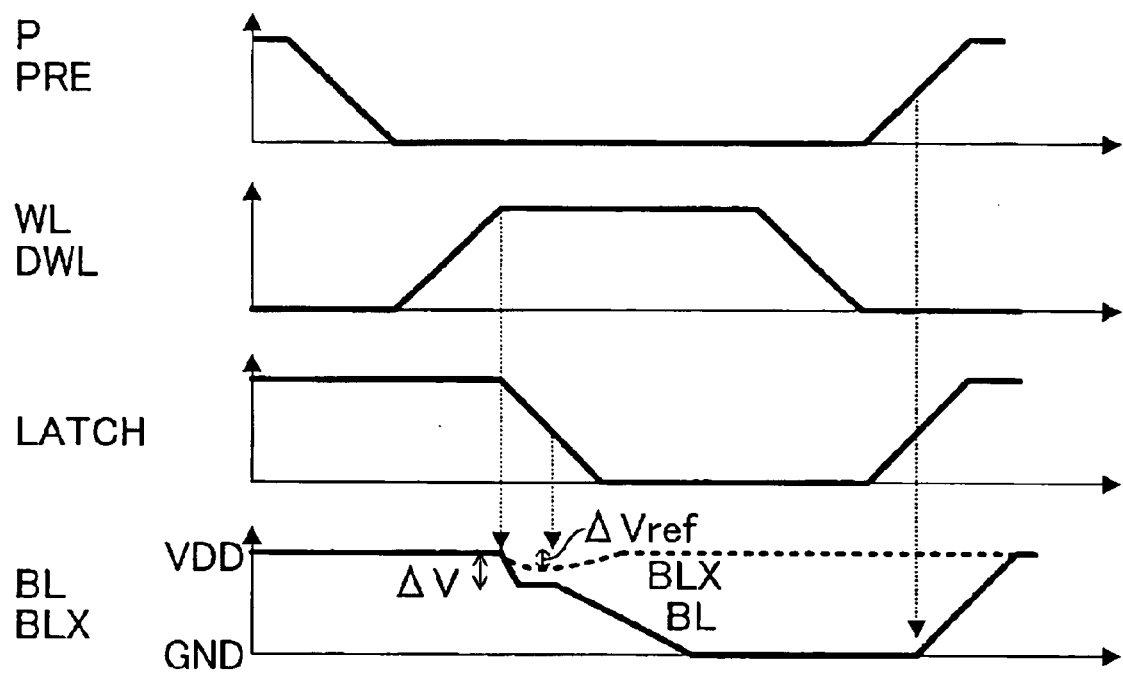

FIG. 15 is a timing chart indicating how data is read by a VDD precharge scheme.

Figure 16:
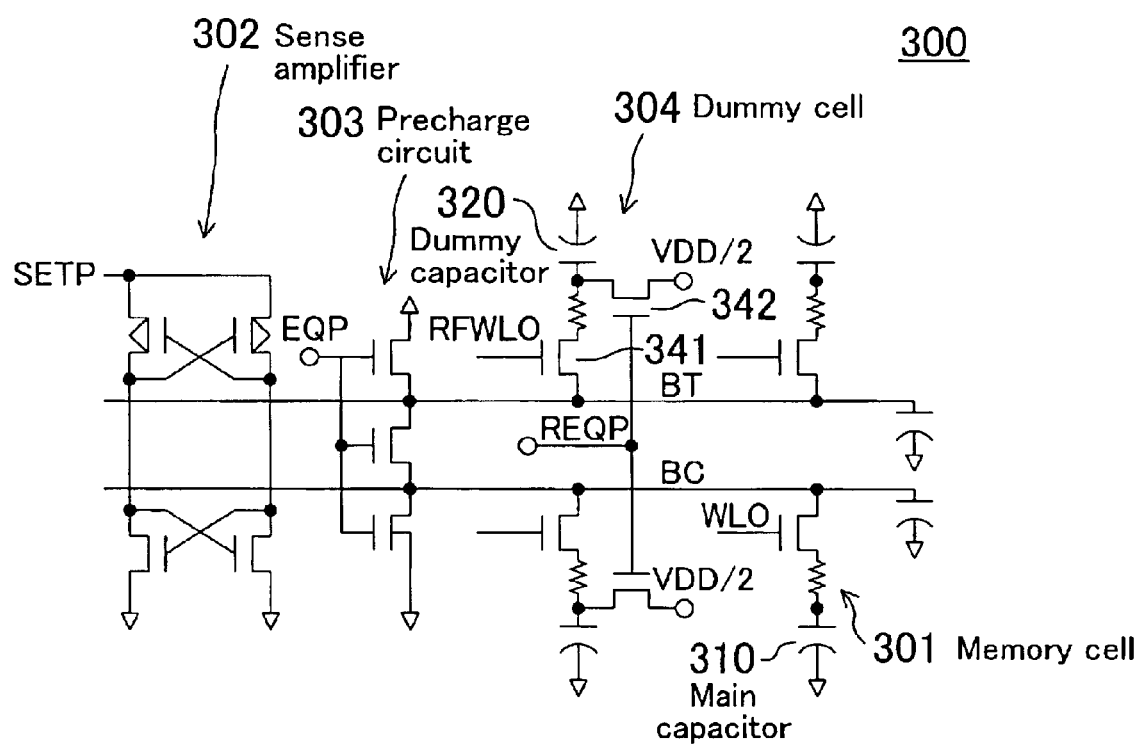

FIG. 16 illustrates the circuit configuration of a conventional GND-precharge DRAM.

Figure 17:
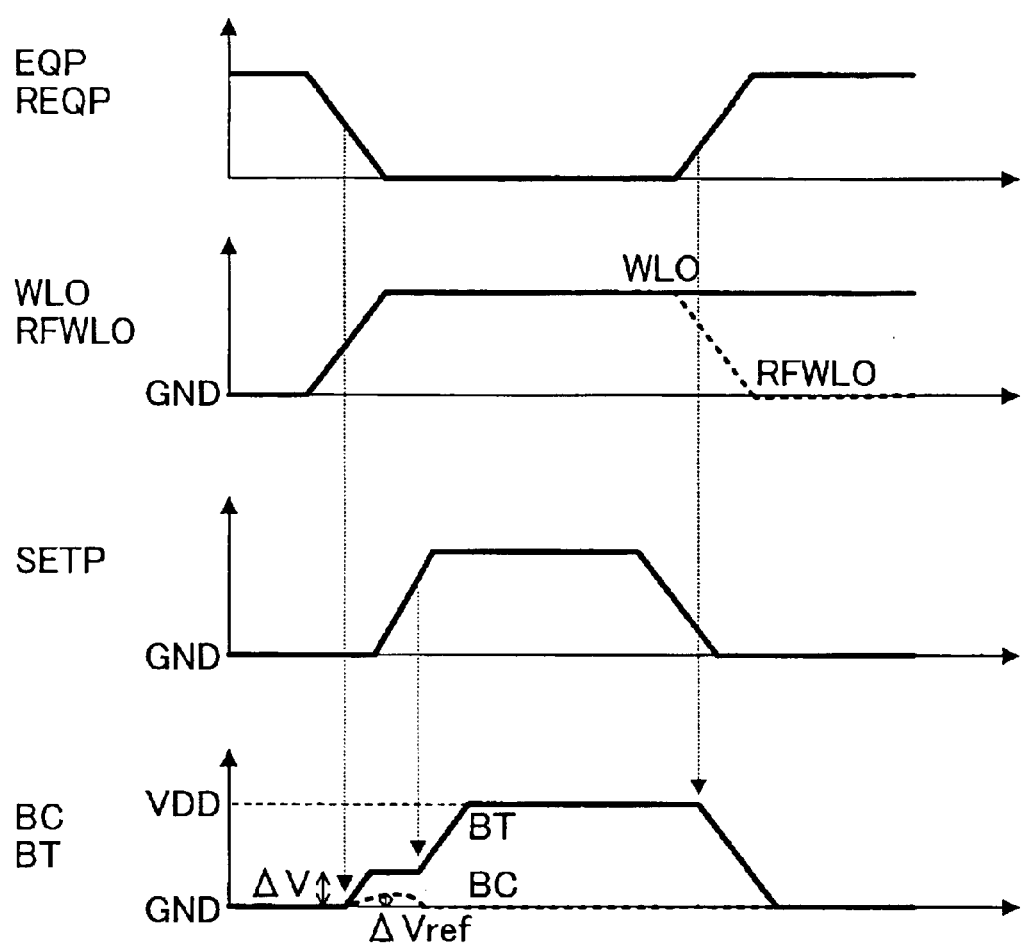

FIG. 17 is a timing chart indicating how data is read by a GND precharge scheme.

DESCRIPTION OF THE PREFERRED EMBODIMENTS

Hereinafter, preferred embodiments of the present invention will be described with reference to the accompanying drawings.

(First Embodiment)

Figure 1:
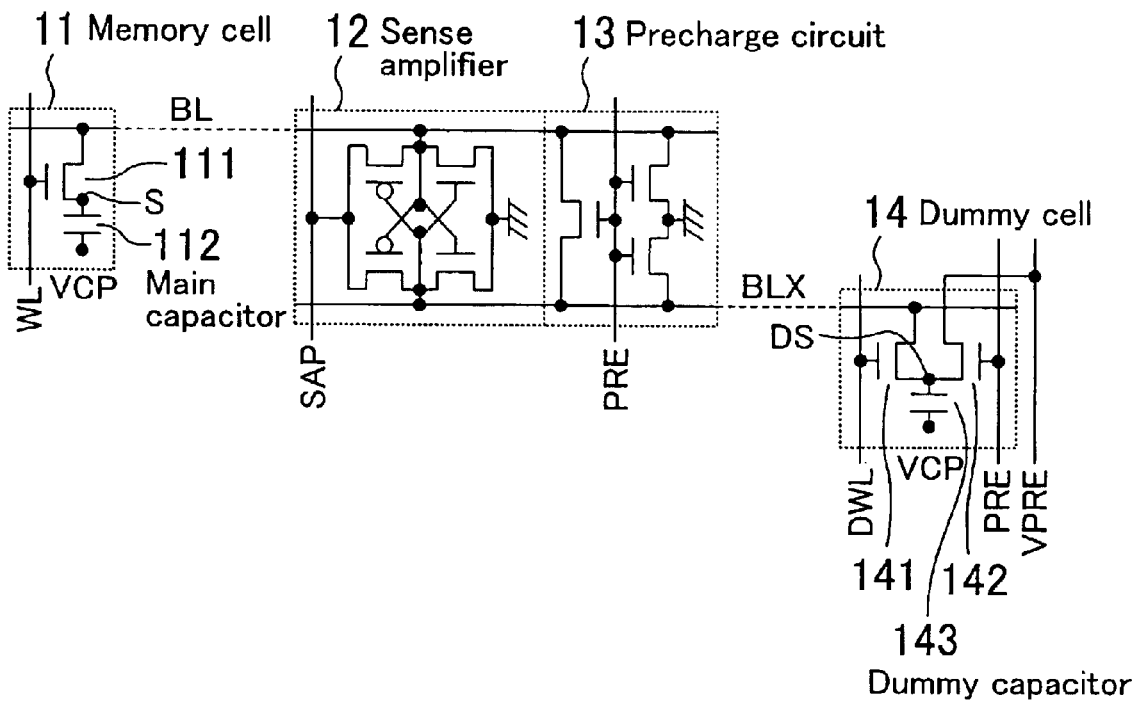
FIG. 1 illustrates the circuit configuration of a semiconductor memory circuit in accordance with a first embodiment of the present invention.

FIG. 1 illustrates the circuit configuration of a semiconductor memory circuit in accordance with a first embodiment of the present invention. The semiconductor memory circuit of this embodiment, a DRAM 10 of NMOS type, includes a memory cell 11, a CMOS sense amplifier 12, a precharge circuit 13, and a dummy cell 14. The memory cell 11 is at the intersection of a word line WL and a bit line BL. The CMOS sense amplifier 12 serves to sense and amplify a potential difference between the pair of bit lines BL and BLX. The precharge circuit 13 precharges the bit line pair BL and BLX. The dummy cell 14 is provided at the intersection of a dummy word line DWL and the bit line BLX.

The memory cell 11 is a 1-transistor cell composed of an NMOS transistor 111 and a main capacitor 112. The NMOS transistor 111 is turned on by activating the word line WL while the bit line BL is inactive, thereby electrically connecting the main capacitor 112 to the bit line BL.

The sense amplifier 12, which is activated by activation of a signal line SAP, detects a potential difference caused between the bit line pair BL and BLX, and puts one of the bit line pair BL and BLX to a power supply voltage VDD (the activation voltage of the signal line SAP), while putting the other to a GND level.

The precharge circuit 13, which is activated by activating a signal line PRE when the word line WL and the dummy word line DWL are inactive, precharges the bit line pair BL and BLX to the GND level.

The dummy cell 14 is composed of NMOS transistors 141 and 142 and a dummy capacitor 143. The NMOS transistor 141 is turned on by activation of the dummy word line DWL, whereby the dummy capacitor 143 is electrically connected with the bit line BLX. The NMOS transistor 142 is turned on by activating the precharge-signal-supplying signal line PRE when the dummy word line DWL is inactive, thereby electrically connecting the dummy capacitor 143 and a voltage line VPRE with each other. The voltage line VPRE supplies the power supply voltage VDD.

In the DRAM 10 with the above-mentioned configuration, the dummy capacitor 143 is configured so as to have capacitance smaller than, preferably about half of, the capacitance of the main capacitor 112.

Figure 2A:
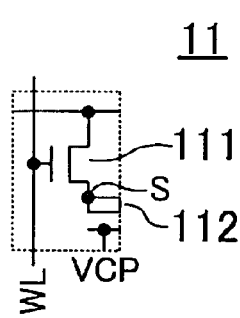
Figure 2B:
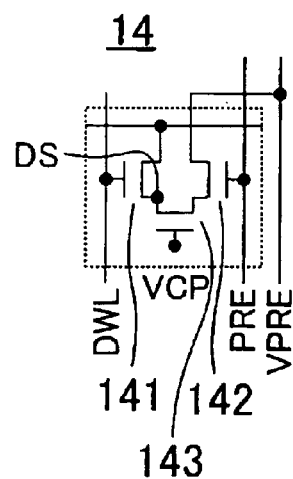
FIG. 2B illustrates a circuit configuration in a case in which a dummy cell in the semiconductor memory circuit of FIG. 1 is formed of a planar capacitor cell.

FIGS. 2A and 2B illustrate a circuit configuration in a case where the memory cell 11 and the dummy cell 14 are formed of planar capacitor cells. FIG. 2A shows the memory cell 11, while FIG. 2B shows the dummy cell 14. The capacitance of the dummy capacitor 143 is about half of the capacitance of the main capacitor 112.

Figure 3:
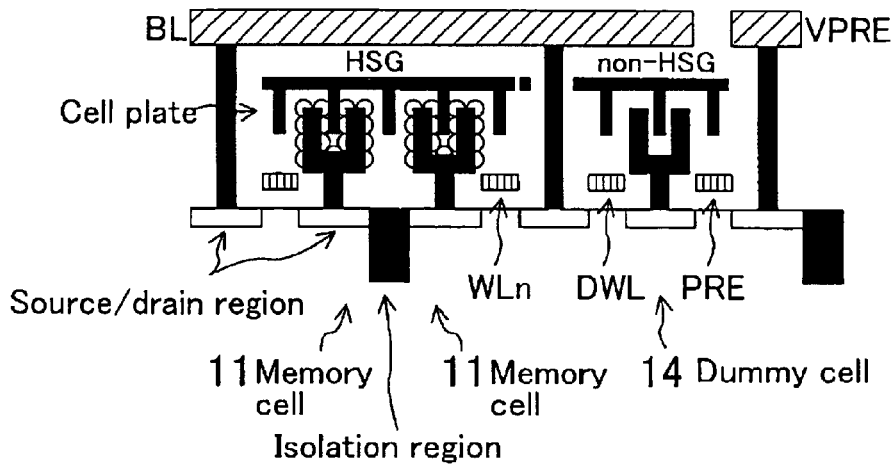
FIG. 3 illustrates a section of a circuit in a case where a memory cell and a dummy cell in the semiconductor memory circuit of FIG. 1 are formed of a stacked capacitor cell with HSG structure and a stacked capacitor cell with non-HSG structure, respectively.

FIG. 3 illustrates a section of a circuit in a case where the memory cells 11 and the dummy cell 14 are both formed of stacked capacitor cells, and in addition the memory cells 11 have HSG structure. In a case of stacked capacitor cells, the size of the memory cells 11 is optimized to be the smallest size obtainable by ultrafine processing, such that it is difficult to make the dummy cell 14 be smaller in size than the memory cell 11 in order for the dummy cell 14 to have smaller capacitance. In view of this, in the HSG structure formation process, if the dummy cell 14 is masked so that only the memory cell 11 is formed with HSG structure, it is possible to obtain the dummy cell 14 having the same size as, but smaller capacitance than, the memory cell 11.

Figure 4:
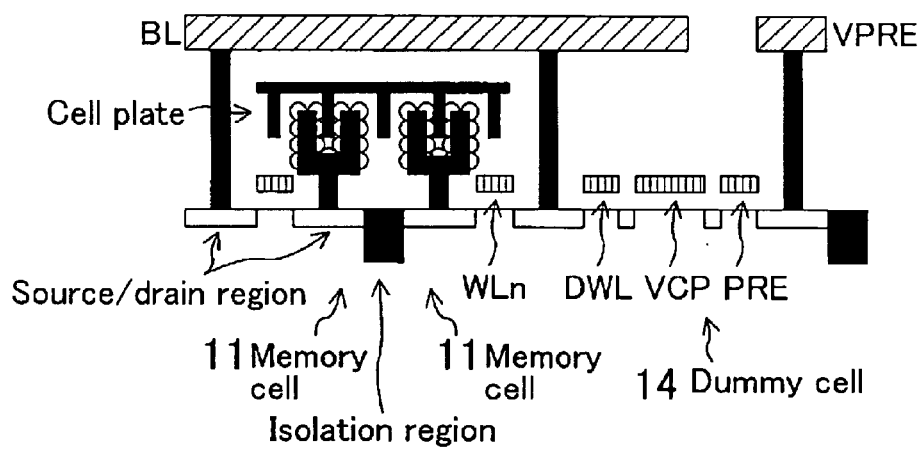
FIG. 4 illustrates a section of a circuit in a case where a memory cell and a dummy cell in the semiconductor memory circuit of FIG. 1 are formed of a stacked capacitor cell and a planar capacitor cell, respectively.
Figure 5:
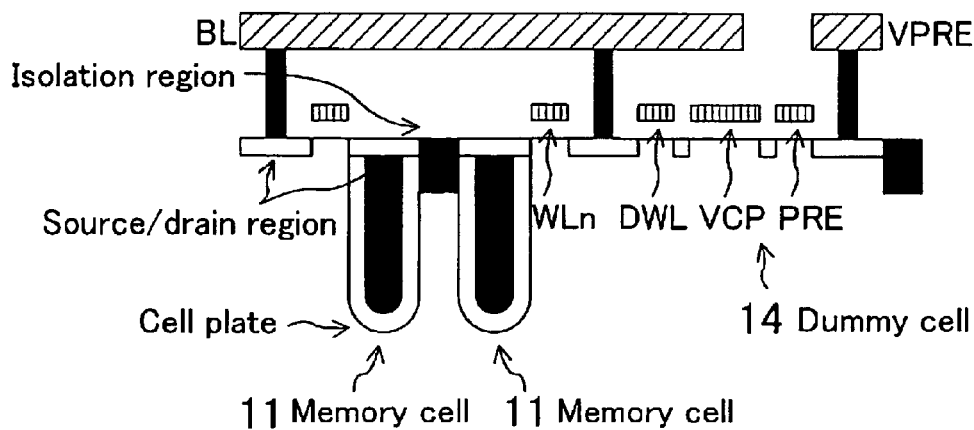
FIG. 5 illustrates a section of a circuit in a case where a memory cell and a dummy cell in the semiconductor memory circuit of FIG. 1 are formed of a trench capacitor cell and a planar capacitor cell.

FIG. 4 illustrates a section of a circuit in a case where the memory cells 11 are formed of stacked capacitor cells, while the dummy cell 14 is formed of a planar capacitor cell. FIG. 5 illustrates a section of a circuit in a case in which the memory cells 11 are formed of trench capacitor cells, while the dummy cell 14 is formed of a planar capacitor cell. If those capacitor cells are formed to have the same circuit area, the planar capacitor has relatively small capacitance (about 10 fF, for example.), while the stacked and trench capacitors have relatively large capacitance (about 20 fF, for example.) Therefore, forming the memory cell 11 of a stacked or trench capacitor cell, and the dummy cell 14 of a planar capacitor cell allows the degree of integration with respect to the memory cell 11 to be increased by the ultrafine processing, while enabling easy formation of the dummy cell 14 having smaller capacitance than the memory cell 11.

Figure 6:
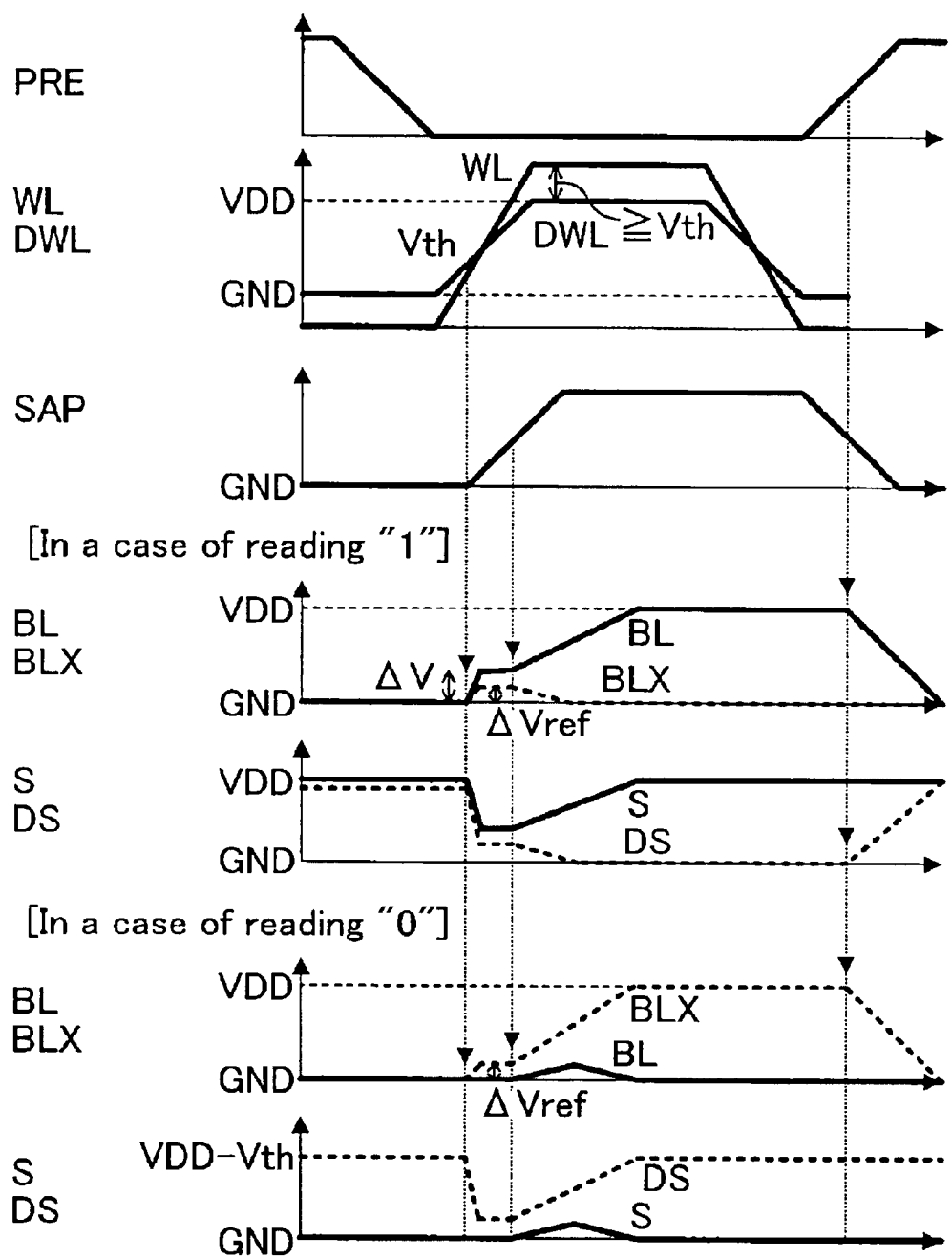
FIG. 6 is a timing chart indicating how the semiconductor memory circuit of FIG. 1 reads data.

Next, referring to a timing chart shown in FIG. 6, it will be described how the DRAM 10 operates, particularly how the DRAM 10 reads data from the memory cell 11.

First, the precharge circuit 13 is activated (PRE="H") when the memory cell 11 is inactive (WL="L"), such that the bit line pair BL and BLX is precharged to the GND level. At this time, in the dummy cell 14, a node DS of the dummy capacitor 143 is supplied with a voltage VDD−Vth, which is lower than the power supply voltage VDD supplied by the voltage line VPRE by the threshold voltage Vth of the NMOS transistor 142, whereby the dummy capacitor 143 is charged.

Next, the signal line PRE is inactivated (PRE="L"), while the word line WL and the dummy word line DWL are activated (WL="H", DWL="H"). This activation causes the potential of the word line WL to be elevated. When the potential of the word line WL exceeds the threshold voltage Vth of the NMOS transistor 111, the NMOS transistor 111 is turned on, thereby electrically connecting the main capacitor 112 with the bit line BL. At this time, if the data stored by the main capacitor 112 is "1", charge accumulated in the main capacitor 112 is supplied to the bit line BL, which increases the potential of the bit line BL by ΔV. On the other hand, if the data stored by the main capacitor 112 is "0", the node S of the main capacitor 112 has a voltage at the GND level, such that little variation is caused in the potential of the bit line BL.

Meanwhile, the activation also causes an increase in the potential of the dummy word line DWL. When the potential of the dummy word line DWL exceeds the threshold voltage Vth of the NMOS transistor 141, the NMOS transistor 141 is turned on, thereby electrically connecting the dummy capacitor 143 with the bit line BLX. As a result, accumulated charge in the dummy capacitor 143 is supplied to the bit line BLX, thereby raising the potential of the bit line BLX by ΔVref.

As described above, since the capacitance of the dummy capacitor 143 is about half of that of the main capacitor 112, the charge accumulated in the dummy capacitor 143 at this time is about half of the charge corresponding to the stored data "1" in the main capacitor 112. Therefore, the increase ΔVref in the bit line BLX potential is about half of the increase ΔV in the bit line BL potential (ΔVref=ΔV/2). Accordingly, the magnitude of the potential difference caused between the bit line pair BL and BLX is ΔVref by which the potential of the bit line BL is higher or lower with respect to the potential of the bit line BLX. This potential difference is sensed and amplified by the sense amplifier 12, thereby enabling the stored data "1" or "0" to be read from the DRAM 10.

Another feature that the DRAM 10 of this embodiment presents is voltages obtained when the dummy word line is activated and inactivated, which will be discussed below.

As can been seen from the timing chart, the activation voltage of the word line WL is higher than the power supply voltage VDD by at least the voltage Vth, while the activation voltage of the dummy word line DWL is the power supply voltage VDD. This difference in the activation voltage is made for the following reasons. Specifically, the activation voltage of the word line WL has to be a voltage determined with consideration of the expected voltage decrease Vth caused by the NMOS transistor 111, that is, a voltage higher than the power supply voltage VDD by at least the voltage Vth, so that the main capacitor 112 can be charged at a relatively high voltage at the time that the memory cell 11 is refreshed. On the other hand, accumulation of charge in the dummy capacitor 143 is carried out by the NMOS transistor 142 serving as a precharge transistor, and the dummy capacitor 143 is electrically connected to the bit line BLX by activating the dummy word line DWL. Therefore, a raised voltage does not have to be supplied to the dummy word line DWL.

As can be also seen from the timing chart, the inactivation voltage of the word line WL is lower than the GND level, while the inactivation voltage of the dummy word line DWL is at the GND level. The reasons for this are as follows. As the inactivation voltage of the word line WL, a negative potential has to be given in order that leakage of the charge of the main capacitor 112 due to the subthreshold current of the NMOS transistor 111 be suppressed in the memory cell 11 so as to increase the charge-retention characteristics. On the other hand, the dummy cell 14 does not serve to store data, such that leakage of the charge of the dummy capacitor 143 does not have to be considered. Accordingly, the inactivation voltage at the GND level is sufficient for the dummy word line DWL.

Setting the activation and inactivation voltages for the dummy word line DWL in the above-mentioned manner results in suppression of the amplitude of the dummy word line DWL, thereby permitting the power consumption of the DRAM 10 to be decreased. In addition, the voltages supplied to the dummy word line DWL do not need to be increased nor decreased with respect to the power supply voltage VDD and the GND voltage, respectively, which allows a reduction in the size of power supply circuits (not shown) such as charge pump circuits as well as in the standby current. As a result, the circuit area and the power consumption can be reduced.

As mentioned above, in this embodiment, the data reading speed of the NMOS DRAM 10 is enhanced by virtue of the adoption of the GND precharge method. In addition, in forming the dummy cell 14, complicated processing is not necessary.

Additionally, the activation and inactivation voltages for the dummy word line DWL are not raised nor decreased from the power supply voltage VDD level and the GND level, respectively. This enables a reduction in the power consumption as well as in the power-supply circuitry size. It will be appreciated that the non-raising and the non-lowering of the voltages do not both have to be implemented, in that effects similar to those described above can be obtained by implementing either the one or the other.

In this embodiment, the technique in which only the potential of the word line is increased or decreased, while the dummy word line potential is not raised nor reduced, is applied to the DRAM in which the memory cell transistors are formed of NMOS transistors, and which performs high-speed data-read operation adopting the GND precharge scheme. However, such technique, in which only the potential of a word line is increased or decreased, while the potential of a dummy word line is not raised nor reduced, may be applied to ordinary DRAMs using dummy cells, for example, DRAMs in which memory cell transistors are NMOS transistors and the VDD precharge scheme is adopted. Even in this case, a reduction in the power consumption and in the power-supply circuitry size can be achieved.

It should be noted that if the NMOS transistor 112 in the memory cell 11 and the NMOS transistor 143 in the dummy cell 14 are designed so as to have equivalent characteristics, the word line WL and the dummy word line DWL can be loaded at substantially the same level. It is then easy to make the word line WL and the dummy word line DWL be in phase with each other, whereby the point in time when the sense amplifier 12 is activated, that is, when the signal line SAP is activated, can be made earlier. As a result, the speed of data reading can be enhanced further.

Figure 7:
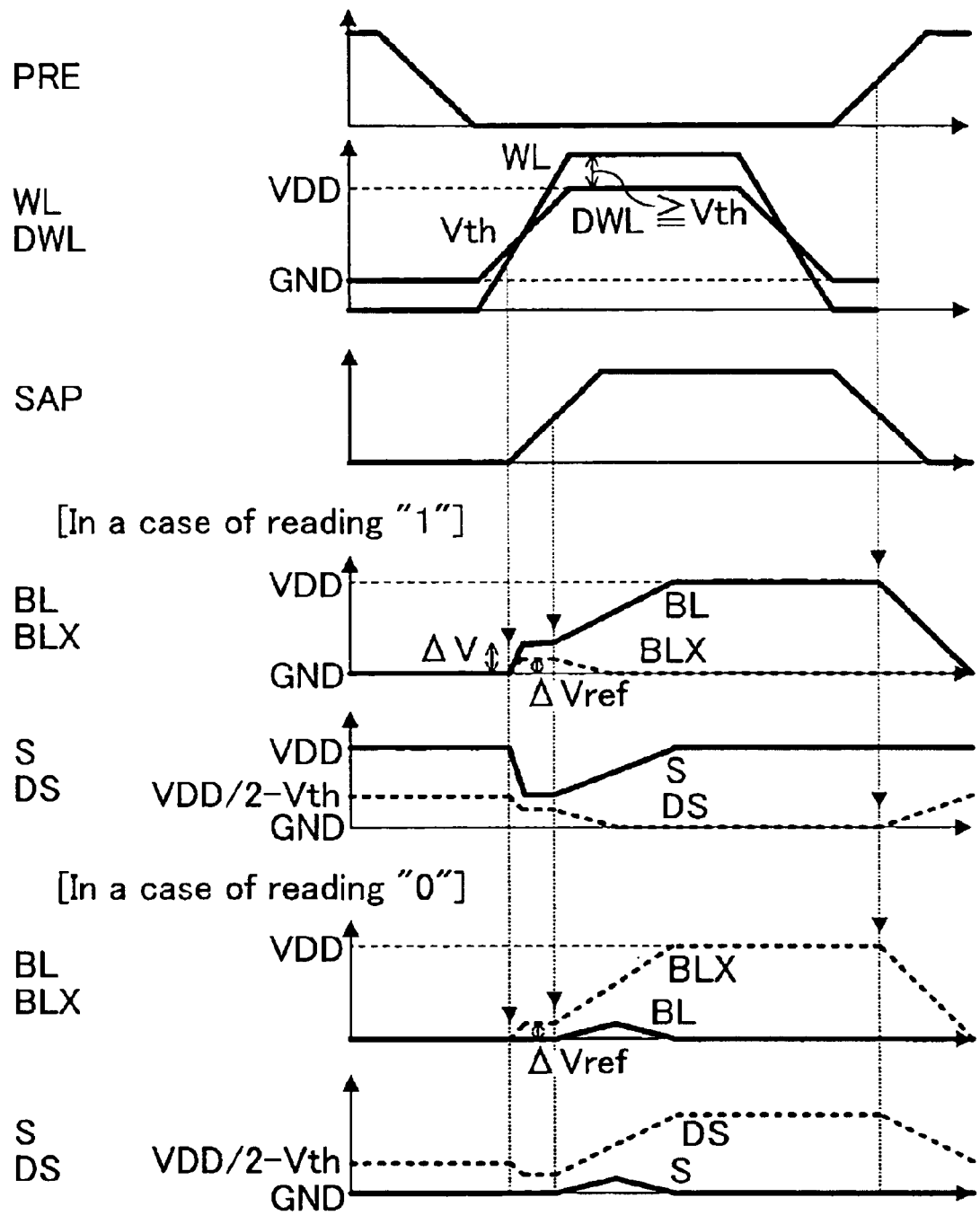
FIG. 7 is a timing chart with respect to data-read operation performed in a case where a main capacitor and a dummy capacitor in the semiconductor memory circuit of FIG. 1 have almost the same capacitance.

In the above description, although the capacitance of the dummy capacitor 143 is about half of that of the main capacitor 112, the dummy capacitor 143 may be configured so as to have substantially the same capacitance as the main capacitor 112. In that case, the voltage supplied by the voltage line VPRE should be smaller than the power supply voltage VDD, preferably be the voltage VDD/2 which is an intermediate voltage between the power supply voltage VDD and the GND voltage. Then, the dummy capacitor 143 will be precharged to a voltage that is approximately half of the precharge voltage of the main capacitor 112, and charge accumulated in the dummy capacitor 143 will be about half of that of the main capacitor 112. FIG. 7 illustrates a timing chart for data read operation performed in a case of a circuit configuration in which the main capacitor 112 and the dummy capacitor 143 have almost the same capacitance. Even if the DRAM 10 is configured in this manner, effects similar to those of this embodiment can be obtained.

(Second Embodiment)

Figure 8:
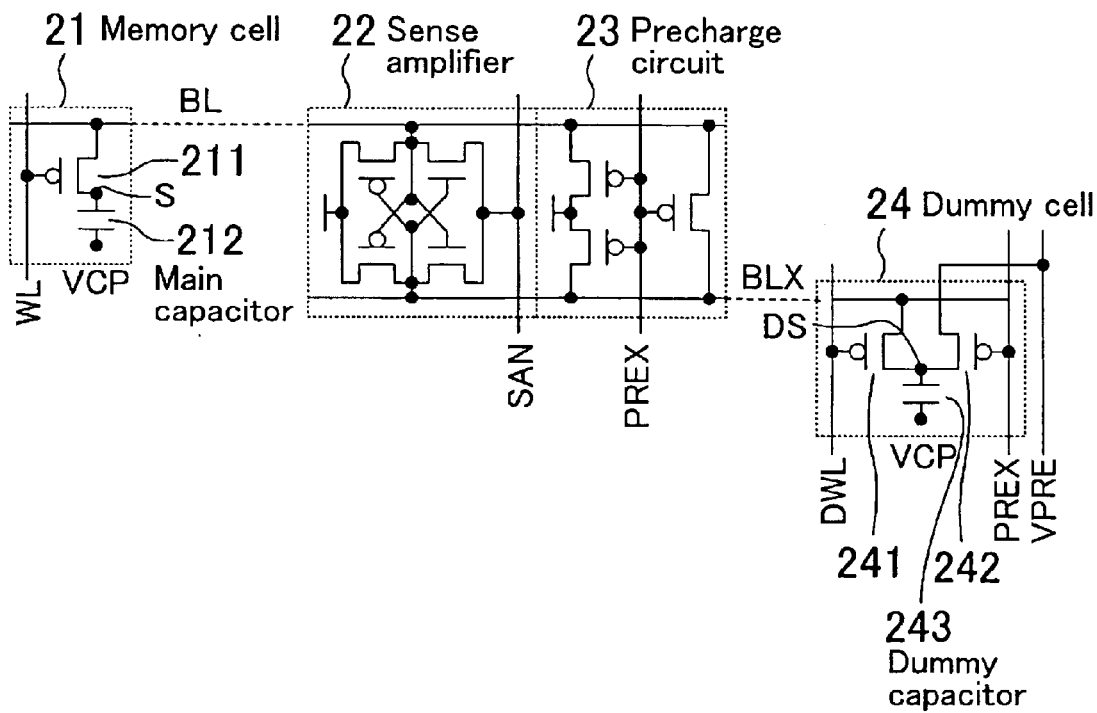
FIG. 8 illustrates the circuit configuration of a semiconductor memory circuit in accordance with a second embodiment of the present invention.

FIG. 8 illustrates the circuit configuration of a semiconductor memory circuit in accordance with a second embodiment of the present invention. The semiconductor memory circuit of this embodiment, a DRAM 20 of PMOS type, includes a memory cell 21, a CMOS sense amplifier 22, a precharge circuit 23, and a dummy cell 24. The memory cell 21 is at the intersection of a word line WL and a bit line BL. The CMOS sense amplifier 22 serves to sense and amplify a potential difference between the pair of bit lines BL and BLX. The precharge circuit 23 precharges the bit line pair BL and BLX. The dummy cell 24 is provided at the intersection of a dummy word line and the bit line BLX.

The memory cell 21 is a 1-transistor cell composed of a PMOS transistor 211 and a main capacitor 212. The PMOS transistor 211 is turned on by activating the word line WL when the bit line BL is inactivated, thereby electrically connecting the main capacitor 212 to the bit line BL.

The sense amplifier 22, which is activated by activation of a signal line SAN, senses a potential difference caused between the bit line pair BL and BLX, and puts one of the bit line pair BL and BLX to a power supply voltage VDD, while putting the other to a GND level (the activation voltage of the signal line SAN).

The precharge circuit 23, which is activated by activating a signal line PREX when the word line WL and the dummy word line DWL are inactive, precharges the bit line pair BL and BLX to the power supply voltage VDD.

The dummy cell 24 consists of PMOS transistors 241 and 242 and a dummy capacitor 243. The PMOS transistor 241 is turned on by activation of the dummy word line DWL, thereby electrically connecting the dummy capacitor 243 to the bit line BLX. The PMOS transistor 242 is turned on by activating the precharge-signal supplying signal line PREX when the dummy word line DWL is inactive, thereby electrically connecting the dummy capacitor 243 to a voltage line VPRE. The voltage line VPRE supplies the GND voltage.

In the DRAM 20 with the above-mentioned configuration, the dummy capacitor 243 is configured so as to have capacitance smaller than, preferably about half of, the capacitance of the main capacitor 212. The specific configuration is as mentioned in the first embodiment.

Figure 9:
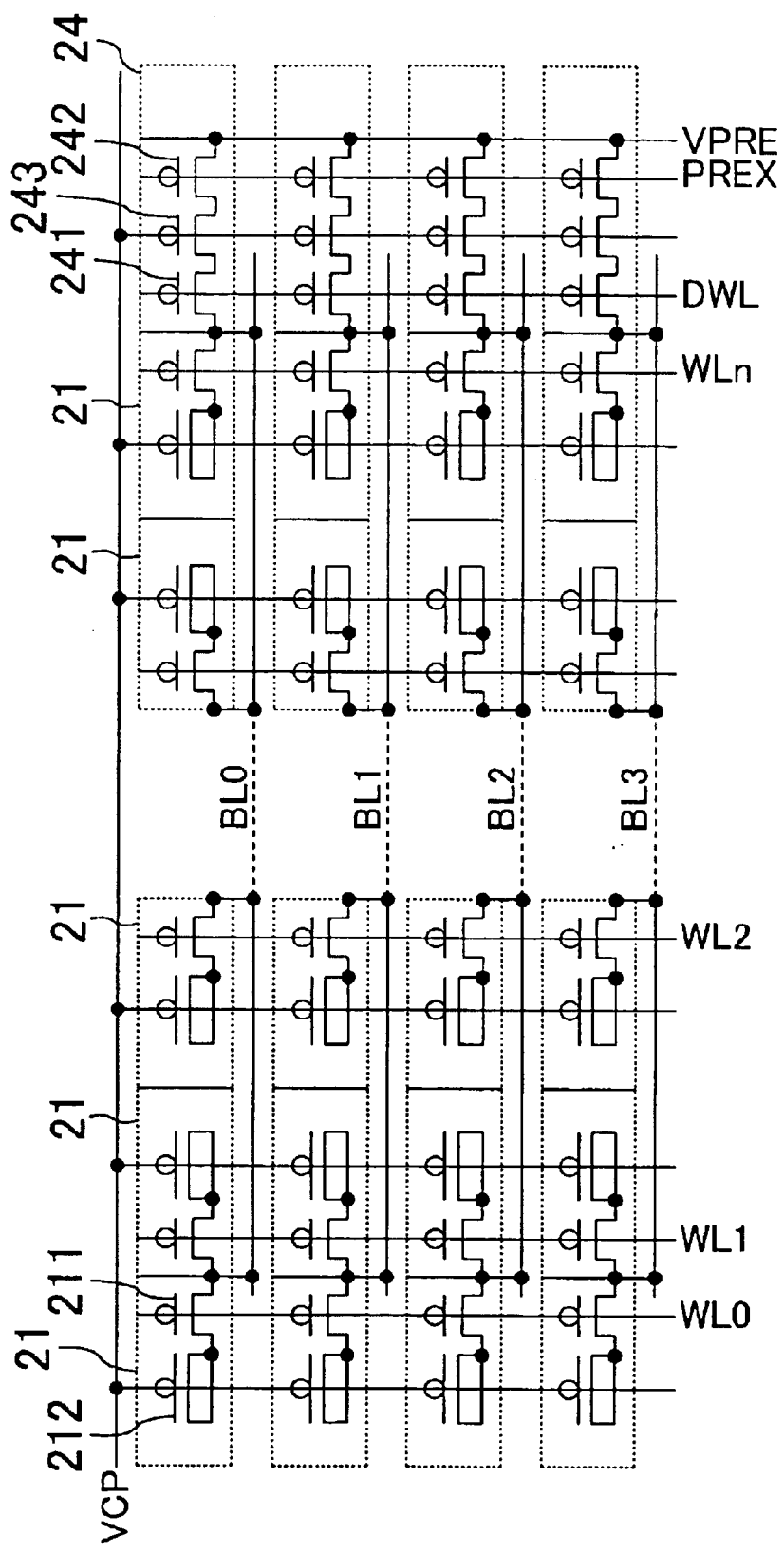
FIG. 9 illustrates the circuit configuration of a memory cell array in a case where the semiconductor memory circuit of FIG. 8 is formed of planar capacitor cells.
Figure 10:
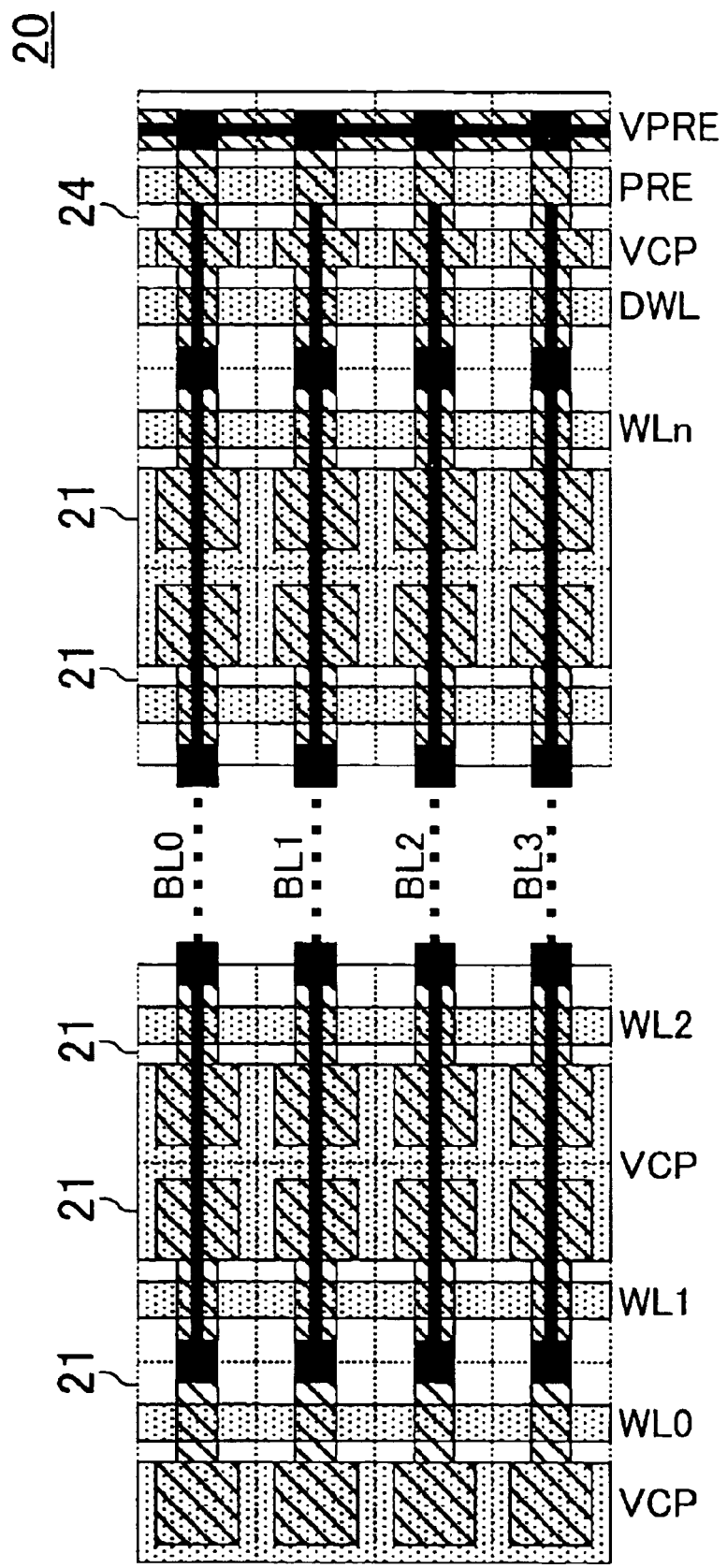
FIG. 10 illustrates a memory-cell-array layout that corresponds to the circuit configuration of FIG. 9.

Hereinafter, the configuration of a memory cell array that includes the memory cell 21 and the dummy cell 24 in the DRAM 20 of this embodiment will be discussed. FIG. 9 illustrates the circuit configuration of a memory cell array in a case where the DRAM 20 is formed of planar capacitor cells. The members are identified by the same reference numerals as those shown in FIG. 8. FIG. 10 illustrates a memory-cell-array layout that corresponds to the circuit configuration shown in FIG. 9. In FIG. 10, active regions in the transistors are indicated by hatched lines.

As shown in FIGS. 9 and 10, in each dummy cell 24, the PMOS transistors 241 and 242 are disposed on a straight line with the capacitor 243 being interposed therebetween. The dummy cell array is disposed parallel to a memory cell array, which allows the dummy cells 24 to be disposed effectively, thereby enabling optimization of the circuitry area. In addition, it is not necessary to form in the dummy cells 24 contact holes for connecting the PMOS transistors 241 and 242 and the dummy capacitors 243 with each other.

Figure 11:
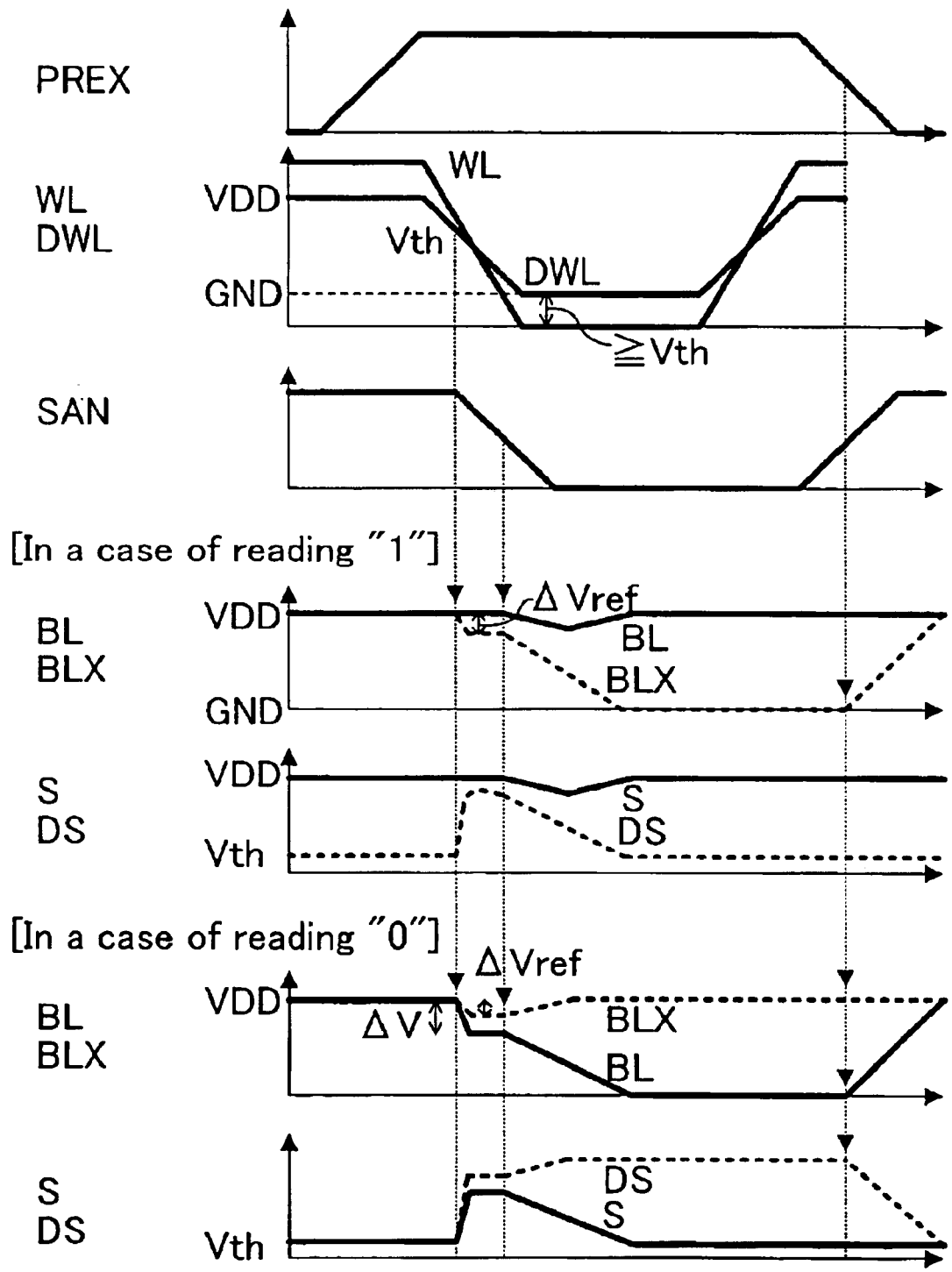
FIG. 11 is a timing chart indicating how the semiconductor memory circuit of FIG. 8 reads data.
Figure 12:
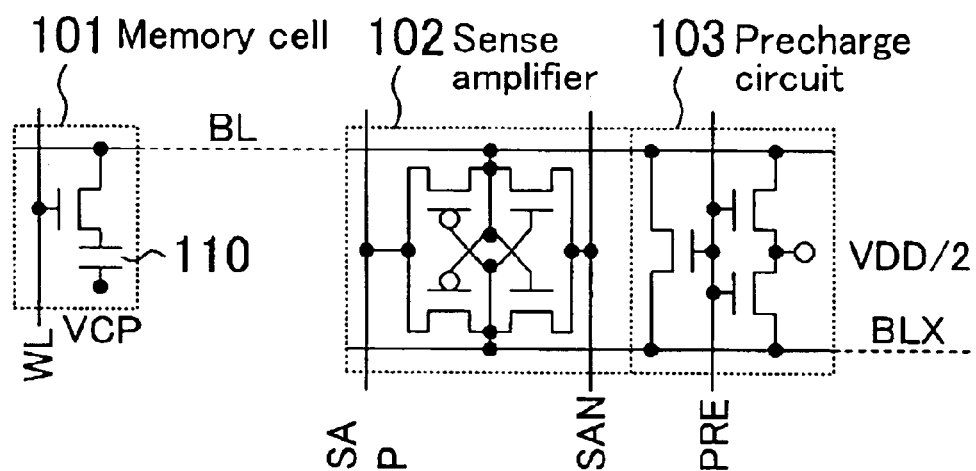
FIG. 12 illustrates the circuit configuration of a typical VDD/2 precharge DRAM.
Figure 13:
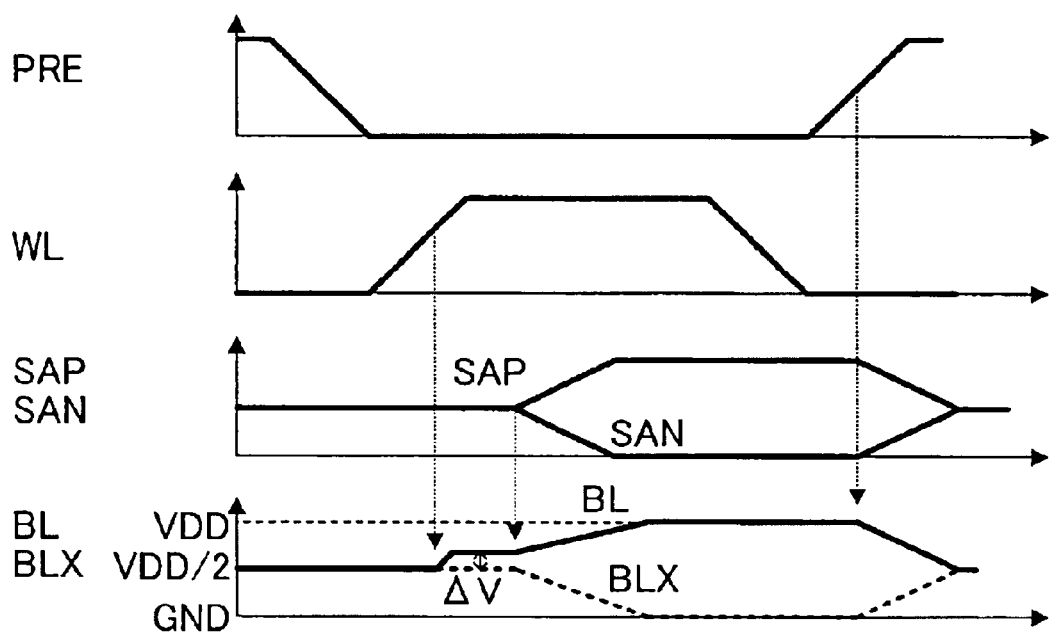
FIG. 13 is a timing chart indicating how data is read by a VDD/2 precharge scheme.

Next, referring to a timing chart shown in FIG. 11, it will be described how the DRAM 20 operates, particularly how the DRAM 20 reads data from the memory cell 21.

First, the precharge circuit 23 is activated (PREX="L") when the memory cell 21 is inactive (WL="H"), whereby the bit line pair BL and BLX is precharged to the power supply voltage VDD. At this time, in the dummy cell 24, a node DS of the dummy capacitor 243 is supplied with a voltage Vth, which is higher than the GND voltage supplied by the voltage line VPRE by the threshold voltage Vth of the PMOS transistor 242, thereby causing the dummy capacitor 243 to discharge.

Then, the signal line PREX is inactivated (PREX="H"), while the word line WL and the dummy word line DWL are activated (WL="L", DWL="L"). This activation results in a decrease in the potential of the word line WL. When the potential of the word line WL goes below the threshold voltage Vth of the PMOS transistor 211, the PMOS transistor 211 is turned on, thereby electrically connecting the main capacitor 212 with the bit line BL. At this time, if the data stored by the main capacitor 212 is "0", accumulated charge in the bit line BL is supplied to the main capacitor 212, causing a decrease in the potential of the bit line BL by ΔV. On the other hand, if the data stored by the main capacitor 212 is "1", the voltage of the node S of the main capacitor 212 is the power supply voltage VDD, such that little variation is caused in the potential of the bit line BL.

Meanwhile, the activation also causes a reduction in the potential of the dummy word line DWL. When the potential of the dummy word line DWL goes below the threshold voltage Vth of the PMOS transistor 241, the PMOS transistor 241 is turned on, thereby electrically connecting the dummy capacitor 243 with the bit line BLX. As a result, accumulated charge in the bit line BLX is supplied to the capacitor 243, thereby decreasing the potential of the bit line BLX by ΔVref.

As described above, since the capacitance of the dummy capacitor 243 is about half of that of the main capacitor 212, the charge accumulated in the dummy capacitor 243 at this time is about half of the charge that corresponds to the stored data "1" in the main capacitor 212. The decrease ΔVref in the bit line BLX potential is thus about half of the decrease ΔV in the bit line BL potential. (ΔVref=ΔV/2) Therefore, the magnitude of the potential difference caused between the bit line pair BL and BLX is ΔVref by which the potential of the bit line BL is higher or lower with respect to the potential of the bit line BLX. This potential difference is sensed and amplified by the sense amplifier 22, thereby enabling the stored data "1" or "0" to be read from the DRAM 20.

As in the DRAM 10 of the first embodiment, the voltage amplitude of the dummy word line DWL is designed so as to be smaller than the voltage amplitude of the word line WL. That is, the activation voltage of the word line WL is lower than the GND level, while the activation voltage of the dummy word line DWL is at the GND level. On the other hand, the inactivation voltage of the word line WL is higher than the power supply voltage VDD by at least the voltage Vth, while the inactivation voltage of the dummy word line DWL is the power supply voltage VDD. Effects obtainable by suppressing the voltage amplitude of the dummy word line DWL are as described in the first embodiment. Furthermore, as described in relation to the first embodiment, the effects obtainable by suppressing the voltage amplitude of the dummy word line DWL with respect to the voltage amplitude of the word line WL are attainable not only in this embodiment but also in a case in which the bit lines are precharged to the GND-voltage level.

As mentioned above, according to this embodiment, the data reading speed of the DRAM 20 of PMOS type is enhanced by virtue of the adoption of the VDD precharge system. In addition, in forming the dummy cells 24, complicated processing is not necessary.

Furthermore, in a case in which the memory cells 21 and the dummy cells 24 are formed of planar capacitor cells, the dummy cells 24 can be disposed effectively, which enables optimization of the circuitry area. This holds true for the DRAM 10 of the first embodiment.

As in the first embodiment, the capacitance of the main capacitor 212 may be about equal to the capacitance of the dummy capacitor 243, and the voltage supplied by the voltage line VPRE may be higher than the GND level, preferably be the voltage VDD/2, which is approximately midway between the power supply voltage VDD and the GND level.

Moreover, the semiconductor memory circuits of the present invention may be applied to memories on embedded memory LSIs on which arithmetic sections and the memories are integrated.

As explained above, according to the present invention, in a semiconductor memory circuit, a pair of bit lines is precharged in accordance with the inactivation voltage of a word line, whereby charge reallocation occurs between memory cells and the bit lines at a relatively high speed, thereby allowing the data-reading speed to be enhanced.

Furthermore, suppressing the amplitude of a dummy word line permits a reduction in the size of power supply circuitry incorporated into the semiconductor memory circuit and in the power consumption by the semiconductor memory circuit.

What is claimed is:

1. A semiconductor memory circuit comprising:
a memory cell that includes:
a first capacitor for storing therein electric charge corresponding to stored data, and
a first transistor whose gate is connected to a word line and one of whose source and drain is connected to a first bit line, while the other of whose source and drain is connected to the first capacitor;
a dummy cell that includes:
a second capacitor having smaller capacitance than the first capacitor,
a second transistor whose gate is connected to a dummy word line, and one of whose source and drain is connected to a second bit line, while the other of whose source and drain is connected to the second capacitor, and
a third transistor for electrically connecting the second capacitor with a voltage line in accordance with a precharge signal when the dummy word line is inactive, the voltage line supplying a first voltage;
a precharge circuit for precharging the first and second bit lines to a second voltage when the word line and the dummy word line are inactive; and
a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the first voltage and to the second voltage, or to the second voltage and to the first voltage, respectively,
wherein the transitions of the word line and the dummy word line from the inactivation voltage level to the activation voltage level are both in a direction from the second voltage to the first voltage,
wherein the capacitance of the second capacitor is substantially half of the capacitance of the first capacitor, and
wherein the first and second capacitors are both stacked capacitors, and the first capacitor is formed to have HSG structure.

2. A semiconductor memory circuit comprising:
a memory cell that includes:
a first capacitor for storing therein electric charge corresponding to stored data, and
a first transistor whose gate is connected to a word line and one of whose source and drain is connected to a first bit line, while the other of whose source and drain is connected to the first capacitor;
a dummy cell that includes:
a second capacitor having smaller capacitance than the first capacitor,
a second transistor whose gate is connected to a dummy word line, and one of whose source and drain is connected to a second bit line, while the other of whose source and drain is connected to the second capacitor, and
a third transistor for electrically connecting the second capacitor with a voltage line in accordance with a precharge signal when the dummy word line is inactive, the
voltage line supplying a first voltage;
a precharge circuit for precharging the first and second bit lines to a second voltage when the word line and the dummy word line are inactive; and
a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the first voltage and to the second voltage, or to the second voltage and to the first voltage, respectively, wherein the transitions of the word line and the dummy word line from the inactivation voltage level to the activation voltage level are both in a direction from the second voltage to the first voltage, wherein the capacitance of the second capacitor is substantially half of the capacitance of the first capacitor, wherein the first capacitor is a stacked capacitor, and the second capacitor is a planar capacitor.

3. A semiconductor memory circuit comprising:

a memory cell that includes:
- a first capacitor for storing therein electric charge corresponding to stored data, and
- a first transistor whose gate is connected to a word line and one of whose source and drain is connected to a first bit line, while the other of whose source and drain is connected to the first capacitor;

a dummy cell that includes:
- a second capacitor having smaller capacitance than the first capacitor,
- a second transistor whose gate is connected to a dummy word line, and one of whose source and drain is connected to a second bit line, while the other of whose source and drain is connected to the second capacitor, and
- a third transistor for electrically connecting the second capacitor with a voltage line in accordance with a precharge signal when the dummy word line is inactive, the voltage line supplying a first voltage;

a precharge circuit for precharging the first and second bit lines to a second voltage when the word line and the dummy word line are inactive; and a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the first voltage and to the second voltage, or to the second voltage and to the first voltage, respectively, wherein the transitions of the word line and the dummy word line from the inactivation voltage level to the activation voltage level are both in a direction from the second voltage to the first voltage, wherein the capacitance of the second capacitor is substantially half of the capacitance of the first capacitor, and wherein the first capacitor is a trench capacitor, and the second capacitor is a planar capacitor.

4. A The semiconductor memory circuit comprising:

a memory cell that includes:
- a first capacitor for storing therein electric charge corresponding to stored data, and
- a first transistor whose gate is connected to a word line and one of whose source and drain is connected to a first bit line, while the other of whose source and drain is connected to the first capacitor;

a dummy cell that includes:
- a second capacitor having smaller capacitance than the first capacitor,
- a second transistor whose gate is connected to a dummy word line, and one of whose source and drain is connected to a second bit line, while the other of whose source and drain is connected to the second capacitor, and
- a third transistor for electrically connecting the second capacitor with a voltage line in accordance with a precharge signal when the dummy word line is inactive, the voltage line supplying a first voltage;

a precharge circuit for precharging the first and second bit lines to a second voltage when the word line and the dummy word line are inactive; and a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the first voltage and to the second voltage, or to the second voltage and to the first voltage, respectively, wherein the transitions of the word line and the dummy word line from the inactivation voltage level to the activation voltage level are both in a direction from the second voltage to the first voltage, and wherein the amplitude of the dummy word line voltage is smaller than the amplitude of the word line voltage.

5. A semiconductor memory circuit comprising:

a memory cell that includes a first capacitor for storing therein electric charge corresponding to stored data, and a first transistor whose gate is connected to a word line and one of whose source and drain is connected to a first bit line, while the other of whose source and drain is connected to the first capacitor;

a dummy cell that includes
- a second capacitor,
- a second transistor whose gate is connected to a dummy word line, and one of whose source and drain is connected to a second bit line, while the other of whose source and drain is connected to the second capacitor, and
- a third transistor for electrically connecting the second capacitor with a voltage line in accordance with a precharge signal when the dummy word line is inactive, the voltage line supplying a first voltage;
- a precharge circuit for precharging the first and second bit lines to a second voltage when the word line and the dummy word line are inactive; and a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the second voltage and to a third voltage, or to the third voltage and to the second voltage, respectively, wherein the transitions of the word line and the dummy word line from the inactivation voltage level to the activation voltage level are both in a direction from the second voltage to the third voltage; and the amplitude of the dummy word line voltage is smaller than the amplitude of the world line voltage.

6. The semiconductor memory circuit of claim 5, wherein the capacitance of the second capacitor is substantially equal to the capacitance of the first capacitor, and the first voltage is an intermediate voltage between the second and third voltages.

7. The semiconductor memory circuit of claim 5, wherein the first and second transistors are NMOS transistors, and the inactivation voltage of the dummy word line is higher than the inactivation voltage of the word line.

8. The semiconductor memory circuit of claim 7, wherein the inactivation voltage of the word line is lower than the second voltage, and the inactivation voltage of the dummy word line is substantially equal to the second voltage.

9. The semiconductor memory circuit of claim 5, wherein the first and second transistors are PMOS transistors, and the inactivation voltage of the dummy word line is lower than the inactivation voltage of the word line.

10. The semiconductor memory circuit of claim 9, wherein
the inactivation voltage of the word line is higher than the second voltage, and
the inactivation voltage of the dummy word line is substantially equal to the second voltage.

11. A semiconductor memory circuit comprising:
a memory cell that includes:
  a first capacitor for stoning therein electric charge corresponding to stored data, and
  a first transistor whose gate is connected to a word line and one of whose source and drain is connected to a first bit line, while the other of whose source and drain is connected to the first capacitor;
a dummy cell that includes:
  a second capacitor having smaller capacitance than the first capacitor,
  a second transistor whose gate is connected to a dummy word line, and one of whose source and drain is connected to a second bit line, while the other of whose source and drain is connected to the second capacitor, and
  a third transistor for electrically connecting the second capacitor with a voltage line in accordance with a precharge signal when the dummy word line is inactive, the voltage line supplying a first voltage;
a precharge circuit for precharging the first and second bit lines to a second voltage when the word line and the dummy word line are inactive; and
a sense amplifier for detecting a potential difference caused between the first and second bit lines when the word line and the dummy word line are activated to electrically connect the first and second capacitors to the first and second bit lines, respectively, and for amplifying the voltages of the first and second bit lines either to the first voltage and to the second voltage, or to the second voltage and to the first voltage, respectively,
wherein the transitions of the word line and the dummy word line from the inactivation voltage level to the activation voltage level are both in a direction from the second voltage to the first voltage,
wherein the second and third transistors are disposed substantially on a straight line with the second capacitor being interposed between the second and third transistors.

12. The semiconductor memory circuit of claim 11, wherein the first and second capacitors are both planar capacitors.

13. The semiconductor memory circuit of claim 5, wherein the second and third transistors are disposed substantially on a straight line with the second capacitor being interposed the second and third transistors.

14. The semiconductor memory circuit of claim 13, wherein the first and second capacitors are both planar capacitors.

* * * * *